(12) United States Patent
Gorbold et al.

(10) Patent No.: US 9,958,507 B2
(45) Date of Patent: May 1, 2018

(54) CHANNEL VERIFICATION OF MULTIPLE CHANNELS ON ONE CHIP

(75) Inventors: Jeremy Gorbold, Newbury (GB); Colin McIntosh, Newbury (GB); Niall McDermott, Castletroy (IE); Katherine O'Riordan, Raheen (IE); Robert Parle, Oxford (GB); James Stegen, Chicago, IL (US)

(73) Assignee: Analog Devices, Inc., Norwood, MA (US)

( * ) Notice: Subject to any disclaimer, the term of this patent is extended or adjusted under 35 U.S.C. 154(b) by 1388 days.

(21) Appl. No.: 13/467,735

(22) Filed: May 9, 2012

(65) Prior Publication Data

US 2012/0286792 A1 Nov. 15, 2012

Related U.S. Application Data

(60) Provisional application No. 61/483,898, filed on May 9, 2011.

(51) Int. Cl.
*G01N 27/416* (2006.01)
*G01R 31/36* (2006.01)

(52) U.S. Cl.
CPC ................ *G01R 31/3658* (2013.01)

(58) Field of Classification Search
CPC ............ G01R 31/3648; G01R 31/3627; G01R 31/3662; G01R 31/3631; Y02E 60/12
USPC ......................................................... 324/426
See application file for complete search history.

(56) References Cited

U.S. PATENT DOCUMENTS

| | | | | |
|---|---|---|---|---|
| 4,618,857 A | * | 10/1986 | Dubois et al. | 340/654 |
| 5,422,558 A | * | 6/1995 | Stewart | 320/120 |
| 2002/0121901 A1 | * | 9/2002 | Hoffman | 324/426 |
| 2005/0111246 A1 | * | 5/2005 | Lai et al. | 363/157 |
| 2005/0189949 A1 | * | 9/2005 | Shimizu et al. | 324/434 |
| 2008/0238362 A1 | * | 10/2008 | Pinnell et al. | 320/107 |

* cited by examiner

*Primary Examiner* — Arun Williams
(74) *Attorney, Agent, or Firm* — Schwegman Lundberg & Woessner, P.A.

(57) ABSTRACT

A battery monitoring system and method are disclosed. A battery monitor compares data in parallel register files. If voltage deviation above a certain threshold is detected in one register file, the system generates an alert that a fault exists upstream in the system. In order to better detect errors, the system may intentionally alter the voltages on the batteries to be monitored.

21 Claims, 5 Drawing Sheets

200

300

400

500

CHANNEL VERIFICATION OF MULTIPLE CHANNELS ON ONE CHIP

PRIORITY

This application benefits from priority of U.S. application Ser. No. 61/483,898, filed May 9, 2011, the disclosure of which is incorporated herein by reference.

BACKGROUND

Many electronic systems operate in applications in which circuit malfunctions can cause property damage and human casualties. Accordingly, it can be important for such systems to operate reliably and to perform diagnostic operations that regularly monitor performance of such system to confirm that reliable operation is being maintained. A battery monitor is an example of one such electronic system. A battery monitor is an electrical circuit that measures voltages across the individual cells and reports voltage levels to a processing system. The battery monitor can monitor and confirm reliable operation of the battery cells.

System designers also have a need to confirm that the battery monitor itself is operating reliably, to ensure that the data reported by the battery monitor has been gathered and reported properly. If some failure occurred in the battery monitor itself, such that spurious voltage measurements are reported to the processor, the failure may induce a failure in the battery system itself as the processor implements corrective action in response to the spurious data.

DETAILED DESCRIPTION

Systems and methods are disclosed that provide a monitoring and control system that can detect failures and determine what is causing the failure condition. As the demand for portable and reliable power continues to increase, batteries appear to become more complicated and more difficult to control. Additionally, batteries can include more cells to provide more power and the cells can store more power. These trends can make the batteries more volatile and the consequences for failure more severe. Improper operation of a battery can cause premature failure of the battery or can result in a battery becoming unstable, which can cause damage. The monitoring and control system can detect when the battery is not operating correctly as well as detect when erroneous readings are caused by something other than the battery. The ability to detect erroneous reading can avoid failures due other circuits and systems besides the battery pack. This is important because erroneous readings can otherwise induce a failure in the battery pack by taking unnecessary corrective measures that stress the battery.

Figure 1:
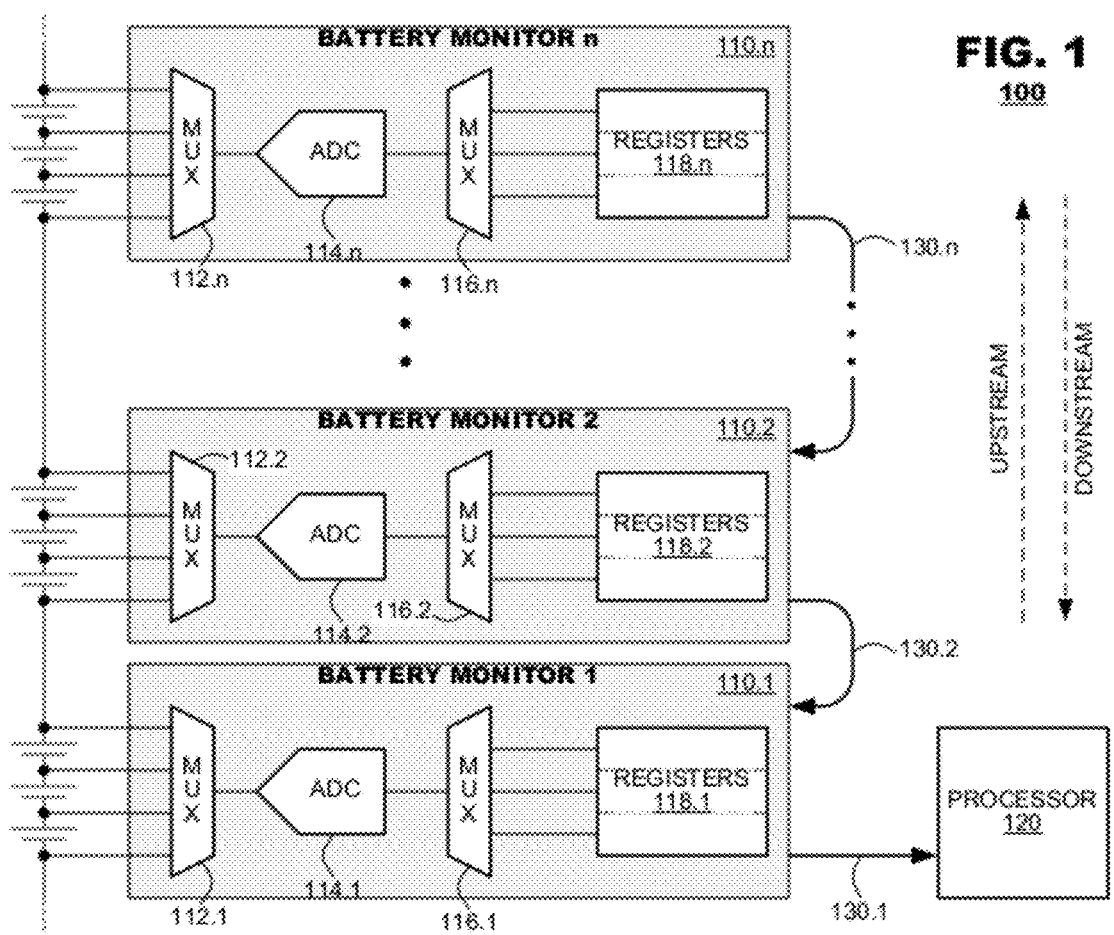
FIG. 1 is a simplified block diagram of a battery monitoring system in which errors may arise.

FIG. 1 illustrates a battery monitoring system. The battery monitoring system can be used to measure operational characteristics of the battery pack, record the characteristics, and detect abnormal characteristics that can induce a failure. The monitoring system 100 includes one or more monitoring units 110.1-110.$n$ and a processor 120. The monitoring units 110.1-110.$n$ may have inputs coupled to respective cells of a battery system. The processor 120 may be coupled to the monitoring units 110.1-110.$n$ via communication links 130.1-130.$n$, which typically are serial bus communication links.

The monitoring units (ex., unit 110.1) may include a first multiplexer ('MUX') 112.1 having inputs coupled to the battery cells; an analog-to-digital converter ('ADC') 114.1 coupled to an output of the respective MUX 112.1; a second MUX 116.1 coupled to an output of the ADC 114.1; and a register file 118.1 for storage of digital data output by the ADC 114.1.

In implementation, each battery monitor may be configured to accept inputs from a predetermined number of battery cells. For example, the configuration illustrated in FIG. 1 shows battery monitors with four inputs which provide capability to monitor three different battery cells. In this regard, the battery monitors 110.1-110.$n$ are considered to be three channel devices. The register file 118.1 may have a number of registers that correspond to the number of channels supported by the monitoring unit 110.1 (e.g., three registers for a three channel device). Other implementations may have a different number of channels than illustrated here.

As noted, the processor 120 may be connected to the battery monitors 110.1-110.$n$ by a variety of communication links, which may operate in a "daisy chain" fashion. In the configuration illustrated in FIG. 1, the communication links may be provisioned as a plurality of serial busses 130.1-130.$n$, each a single bit wide. The processor 120 is directly connected to a first battery monitor 110.1 by a first serial link 130.1. The first battery monitor 110.1 is connected to a second battery monitor 110.2 via a second serial link 130.2. Battery monitors at intermediate positions within the daisy chain are connected to a downstream battery monitor by one serial link and to an upstream battery monitor by a second serial link. The final battery monitor 110.$n$ is connected to a prior battery monitor by a final serial link 130.$n$.

The serial links define a communication flow in two directions, an upstream direction and a downstream direction. In the upstream direction, processor commands are communicated from the processor 120 to the first battery monitor 110.1 and relayed among the battery monitors until they reach the last battery monitor in the chain 110.$n$. In a downstream direction, any battery monitor (say, monitor 110.2) may transmit a message and convey it to an adjacent battery monitor (monitor 110.1) in the direction of the processor. Intermediate battery monitors would relay the message down the daisy chain until a final battery monitor (monitor 110.1) delivers the message to the processor.

In this regard, the battery monitors 110-110.$n$ may include transceiver circuitry to manage communication flow across the communication links 130.1-130.$n$, not shown in FIG. 1. Further description of the battery monitors and their transceiver circuitry may be found in U.S. Publication No. 2008/0183914 and No. 2010/0277231, which are incorporated by reference herein.

During a conversion operation, the first MUX 112.1 activates a pair of inputs associated with a battery cell (a battery "channel") being tested. Voltages from the inputs are routed to the ADC 114.1. Thus, the ADC 114.1 may sample a voltage across the battery cell and may convert it to a digital value representing the sampled voltage. The digital value has a predetermined bit width, for example, 14 bits. The ADC 114.1 may output the digital value to a register associated with the channel being sampled. The battery monitor 110.1 may sample and digitize voltages of each of the battery channels in turn (controlled via an internal state machine) and store digital values for each channel in the register file 118.1. All battery monitoring units 110.1-110.$n$ may operate in this manner.

Malfunctions can arise that cause the MUXes 112.1, 116.1 to operate out of sequence from each other, which may cause a digitized voltage from cell 1 to be stored in a register corresponding to cell 3, for example. Other malfunctions can arise, for example, wires becoming open circuits, which can lead to erroneous data being stored in the result registers. In order to avoid malfunctions from other parts of the system that can cause failures, a control system can be used with the monitoring system to detect malfunctions and analyze the malfunctions to avoid further system failures caused by the malfunctions.

The control system may include an analog to digital converter (ADC), routing logic connecting an input of the ADC to channel inputs of the battery monitor, a pair of register files coupled to an output of the ADC and a plurality of channel drivers. During operation, the battery monitor may digitize voltages at the channel inputs. Thereafter, the battery monitor may drive a selected channel, which induces a voltage change on at least one channel input, and may digitize voltages at the channel inputs a second time. By comparing the voltages, the battery monitor may verify whether an operational error has arisen or not.

Figure 2:
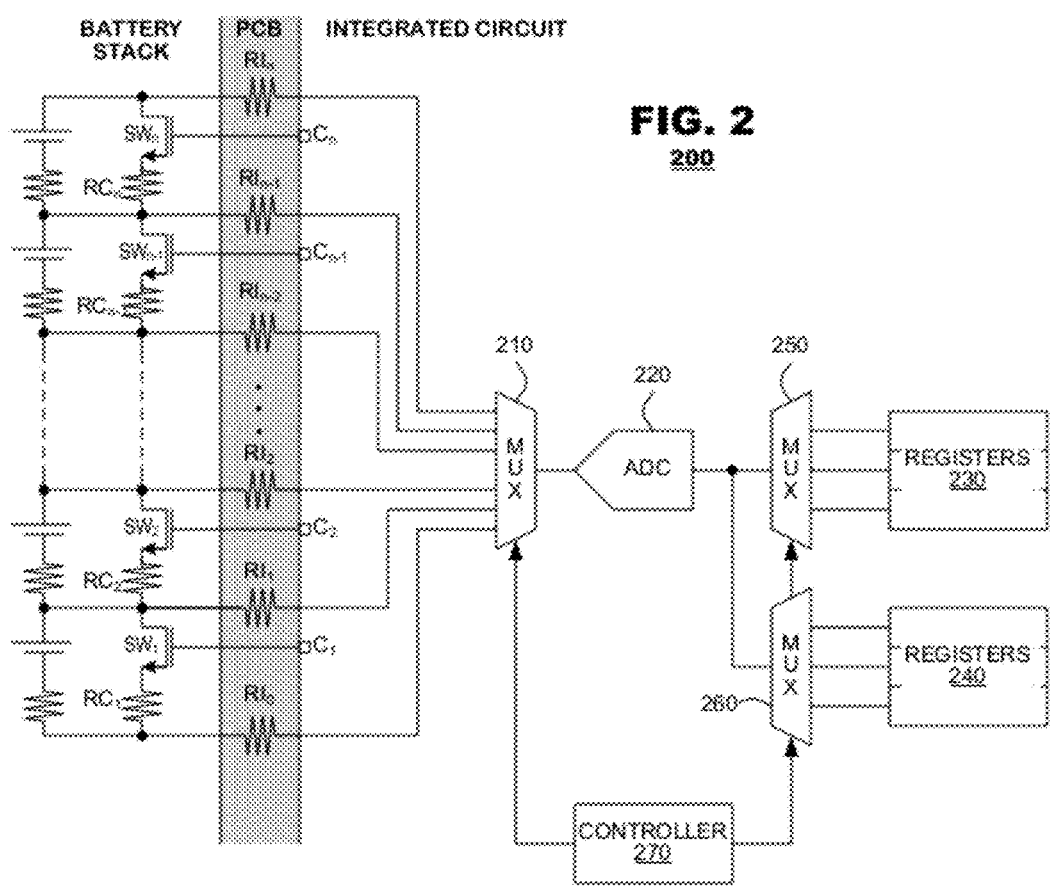
FIG. 2 illustrates operation of a validation process for a multi-channel converter, according to an embodiment of the present invention.

FIG. 2 illustrates a converter 200 according to an embodiment of the present invention shown as connected to cells of a battery stack. In this embodiment, the converter 200 is illustrated as a battery monitor provided as a single integrated circuit. In practice, a multi-cell battery system, such as the system illustrated in FIG. 1, likely will have several converters 200 (not shown) provided corresponding to different cells within the battery stack.

The converter 200 may include an input MUX 210, an ADC 220, a pair of register files 230, 240 and a pair of output MUXes 250, 260 each connecting the ADC's output to a respective register file 230, 240. The converter 200 also may include a plurality of channel drivers, shown as output pins $C_1$-$C_n$, provided for connection to elements within the battery stack. All components within the converter 200 may operate under control of a controller 270.

For an N channel battery monitor 200, the input multiplexer 210 may have inputs coupled to N cells of the battery stack. During operation, the controller 270 may drive a control signal to the input MUX 210 which causes the input MUX 210 to route a pair of inputs corresponding to one of the battery cells to the ADC 220. The ADC 220 may digitize voltages presented on its inputs and generate a digital output representing the input voltage.

Each output MUX 250, 260 may route digital data generated by the ADC 220 to a respective entry of a register file 230, 240. Operation of each output MUX 250, 260 may be controlled by the controller 270. During operation, the controller 270 may control each output MUX 250, 260 independently of the other. For example, the controller 270 may control one of the MUXes (say, MUX 250) to be inactive while the other MUX 260 is controlled to route output data from the ADC 220 to a designated entry of its register file 240. The register files 230, 240 may store digital data input to them from the ADC 220 until read out of the battery monitor via an output bus (FIG. 1) or until consumed or overwritten by the controller 270.

The controller 270 also may drive output signals on the channel drivers $C_1$-$C_n$. In the embodiment illustrated in FIG. 2, the channel drivers $C_1$-$C_n$ may be connected to elements within the battery system, for example, switches S1-Sn that bypass individual battery cells. When one of the channel drivers is activated, for example channel driver C2, it may cause switch SW2 to close and develops a current path around the cell 2 battery, which induces a small change in voltage around the associated cell and, depending on design, neighboring cells. Thus, activation of a channel driver may induce a predetermined change in the voltage(s) sensed at the converter's inputs.

Diagnostic operation of the converter 200 may occur in two phases. In a first phase, the converter 200 may sample and digitize voltages from all cells to which it is connected. Digitized values from the ADC may be stored in the first register file 230. Channel drivers $C_1$-$C_n$ may be inactive during the first phase of operation.

In a second phase, the converter 200 may activate a selected channel driver $C_i$ with a voltage sufficient to render its associated charge balancing switch $SW_i$ conductive. When the switch becomes conductive, it should lower a voltage present across the terminals of the associated cell i. Then after a set delay, the converter 200 may digitize voltages of the cells again and store the results in the second register file 240. At the conclusion of the second digitization operation, the converter 200 may report all digitized values to the processor for validation testing. In another embodiment, the controller 270 may compare values stored in the register files 230, 240 to each other to assess whether the converter 200 has operated properly.

When the converter 200 is operating properly, the register files 230, 240 should store common values of channel voltages for all cells that are not affected by the activated channel driver $C_i$, within a predetermined level of precision. Therefore, if digitized channel voltages for some cell j that is far removed from the activated channel driver $C_i$ differ by more than a predetermined degree, then an error condition arises. Additionally, channel voltages for the cells that are affected by the activated channel driver $C_i$ should vary by a predetermined amount. Therefore, if digitized channel voltages for cell i differ by more than a second predetermined degree when channel driver $C_i$ is tested (or if they fail to differ by the expected amount), an error condition also may be identified.

Figure 3:
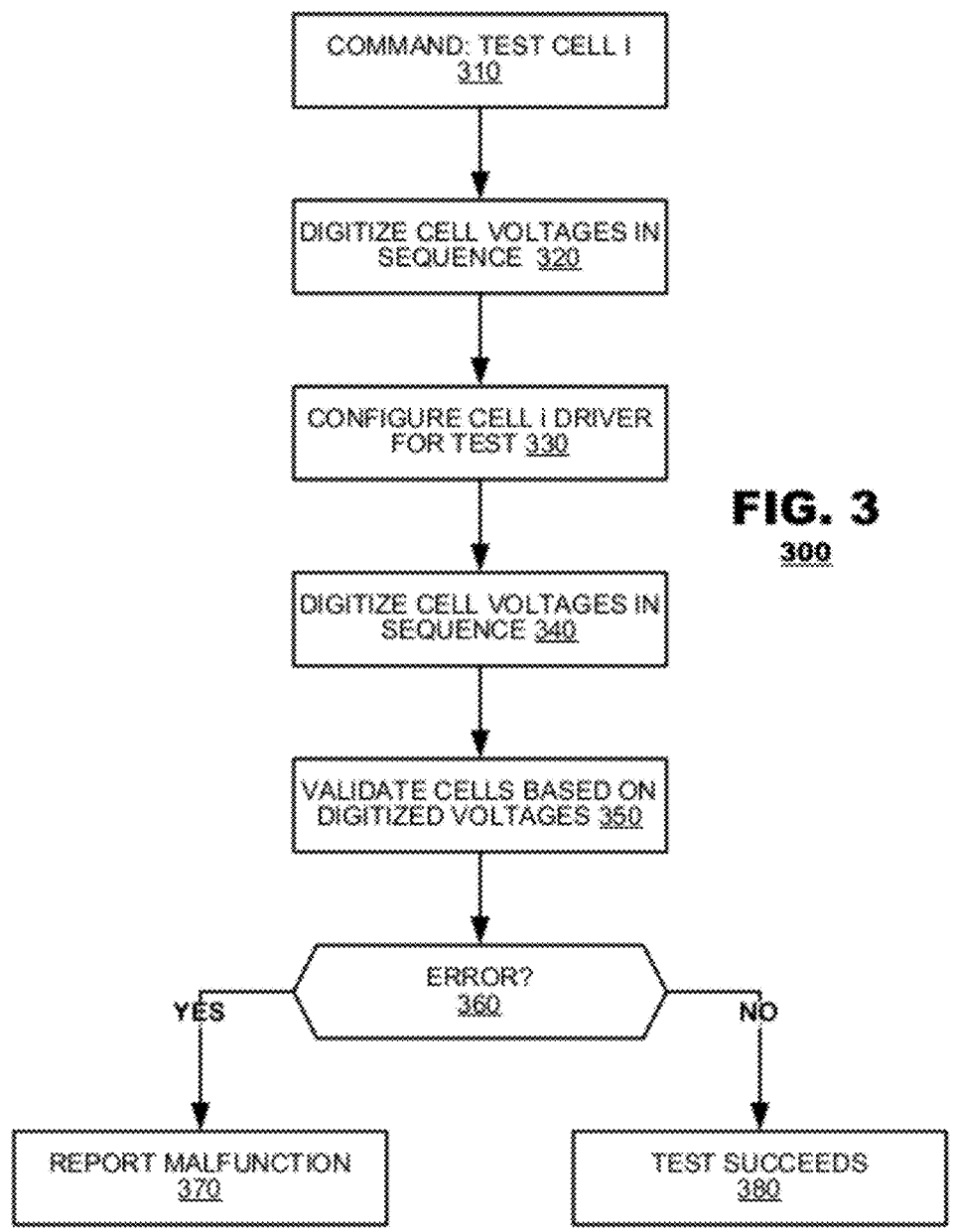
FIG. 3 illustrates a multi-channel converter according to another embodiment of the present invention.

FIG. 3 illustrates operation of a validation method 300 for a multi-channel converter, according to an embodiment of the present invention. The method 300 may begin in step 310, when the converter receives a command indication that a validation test is to be conducted and identifying a channel i that is to be subject to the test. This command may originate from the processor 120. In response, the method 300 in step 320 may digitize the battery cell channel voltages in sequence and store a first set of digitized values. In step 330, the method 300 may reconfigure a driver circuit to channel i to induce a changed voltage in one of the battery cells. After this, the method 300 may digitize all of the battery cells in sequence and store a second set of digitized values as shown in step 340. The validation step begins in step 350, where the method 300 may compare the first and second sets of digitized values on a cell by cell basis to validate operation of the converter.

If the converter is operating properly, then the digitized values of all cells except cell i created in step 340 should match each other within some predetermined range of acceptable error. If the converter is operating properly, then the digitized values of cell i should deviate from each other by a predetermined degree as influenced by the driver circuit's manipulation of cell i in step 330. If the validation test indicates that either of these events fails to occur, then there is the possibility of an error. In step 360, the method 300 may determine whether an error has occurred. If an error has occurred, the method may invoke an error handling procedure. The method may report a malfunction, as shown in step 370, or the method may re-test a seemingly malfunctioning converter to see if the error recurs. If a predetermined number of malfunctions occur within a predetermined time, the method may report a malfunction as shown in step 370. If no error occurred because the digitized value of cell i is within the acceptable range of deviation, the method 300 may determine that the validation test is successful in step 380. Typically, the method 300 will be performed at regular intervals, addressing various channels until all channels are covered within the converter to confirm proper operation of the converter.

In an embodiment, the operations of boxes 320-340 may be performed within each converter under the converter's control, without the need for an external processor to begin the validation method. In this manner, the digitization operations of boxes 320, 340 are likely to occur contemporaneously with each other, for example, within 500 µs. If a validation process were performed under control of an external component, for example, the processor of FIG. 1, latencies induced by the communication links may make a processor-controller validation test ineffective.

Consider an example where a battery system operates in a hybrid electric vehicle or a pure electric vehicle. Such environments typically include large electro-magnetic corruption (EMC) and transients on the battery from acceleration, braking and control of the electric motors. Further, such battery systems can include a large number of cells in the battery system, typically 96 cells, and therefore the system may consume a long time, 8 ms, for example, to read a single set of digitized results from battery monitor(s) to the processor. By the time a processor can command a converter to perform a second conversion on an identified cell, noise or system demands may change voltages read from the cells which would render comparison of result set 1 to result set 2 worthless.

In an embodiment, validation tests may be performed by a component (such as the processor of FIG. 1) that is external to the converter itself. Thus, the first and second sets of digitized voltages may be reported to the processor where the processor executes steps 360, 370, 380 of FIG. 3 to validate the data and determine whether errors have occurred.

Nevertheless, embodiments of the present invention accommodate validation tests that occur within the converter itself, for example, by an onboard controller (see below). In this embodiment, it may be useful also to provide a mechanism to validate operation of the controller as well.

Figure 4:
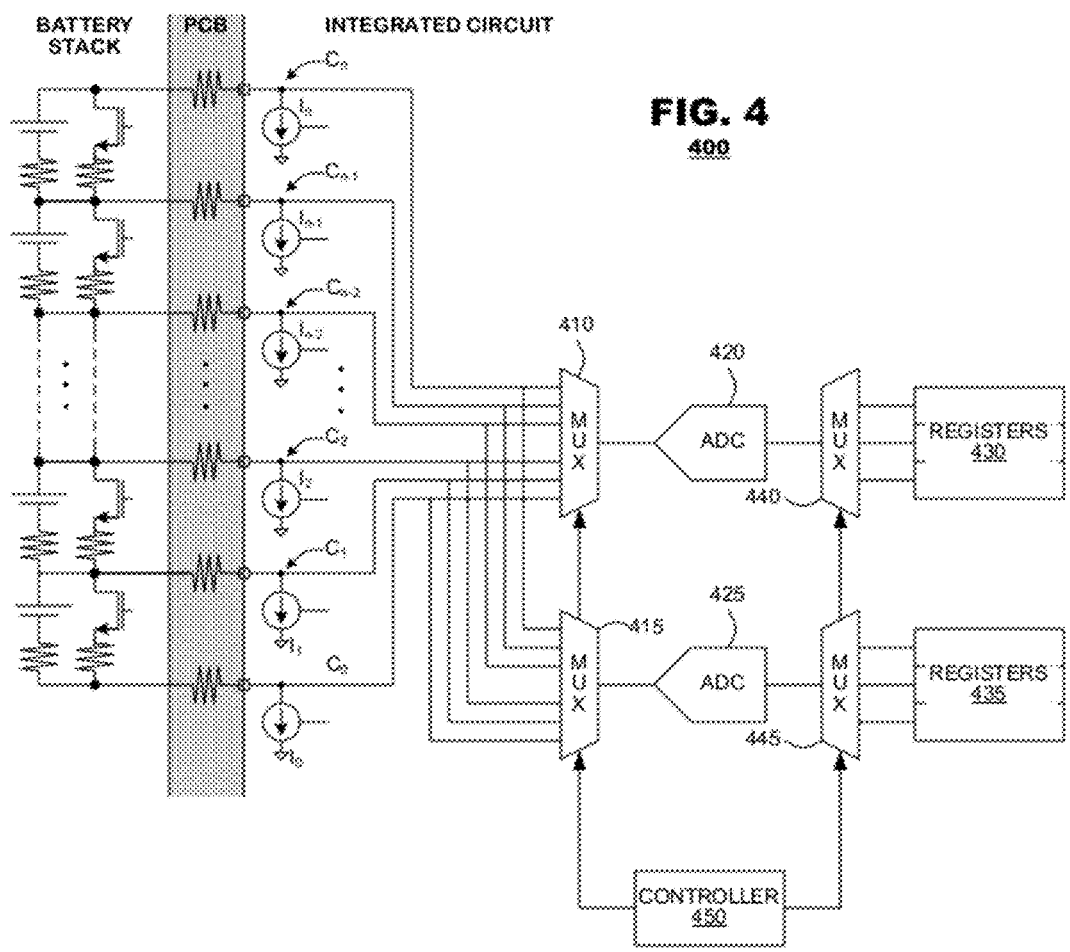
FIG. 4 illustrates a multi-channel converter according to yet another embodiment of the present invention.

FIG. 4 illustrates a multi-channel converter 400 according to an embodiment of the present invention. In this embodiment, the converter again is illustrated as a battery monitor.

The converter 400 may include a pair of input MUXes 410, 415, a pair of ADCs 420, 425, a pair of register files 430, 435, a second pair of MUXes 440, 445 and a controller 450. The input multiplexers 410, 415 each may have inputs coupled to N cells of the battery stack and may output voltages present on a selected input pair to a respective ADC 420, 425. The ADCs 420, 425 each may be coupled to a respective one MUXes 410, 415 and may digitize a voltage different presented at the ADC's inputs. Each of the second pair of MUXes 420, 425 may route digital output of a respective ADC 420, 425 to a designated entry within a respective register file 430, 435.

The converter 400 may include a plurality of channel drivers $C_1$-$C_n$. In the embodiment illustrated in FIG. 4, the channel drivers $C_1$-$C_n$ may include a respective current source $I_0$-$I_n$ connected to input pins of the integrated circuit that are connected to battery cells. These input pins also may be connected to respective inputs of the first MUXes 410, 415. The current sources $I_0$-$I_n$ may be activated by the controller 450 (via connections not shown). The controller also may manage operation of the MUXes 410, 415, 440 and 445. In this embodiment, the converter 400 may selectively activate one or more of the current sources $I_0$-$I_n$ to perform its diagnostic test.

The input MUXes 410 and 415 are connected in parallel to the various cells of the battery stack, with current sources connected serially between the battery cells and both input MUXes. The operation of the input MUXes 410 and 415 may be controlled by controller 450. During operation, the controller 450 may control each input MUX 410, 415 independently of the other MUX. For example, the controller 450 may direct input MUX 410 to be inactive while directing MUX 415 to route data to its respective ADC 425. Each input MUX has its output connected to a respective ADC 420, 425 for converting the analog battery cell voltage levels to digital values. Once this digitization occurs, a second set of MUXes 440, 445 (which are also controlled by controller 450) is used to route digital data into a set of register files 430, 435. After a set delay, the converter 400 may store the digital results in the register files 430, 435. At the conclusion of the digitization operation, the converter 400 may report all digitized values to the processor for validation testing. In another embodiment, the controller 450 may compare values stored in the register files 430, 430 to each other to assess whether the converter 400 has operated properly.

The converter 400 may receive a command to engage in a validation test identifying one of the cells to be tested (say, cell n−1). In response, the battery monitor may sample and digitize voltages from all cells to which it is connected using the first MUX 440, and first ADC 420. Digitized values from the first ADC 420 may be stored in the first register file 430.

Thereafter, the converter 400 may activate the designated current source $I_{n-1}$ via control $C_{n-1}$. In the embodiment illustrated in FIG. 4, the current sources are oriented to sink current from each individual battery cell. Activation of the current source $I_{n-1}$, therefore, should lower a voltage present across the terminals of cell n−1 absent improper operation. The battery monitor 400 may digitize voltages of the cells again using the second MUX 445, and second ADC 425, and store the results in the second register file 435. At the conclusion of the second digitization operation, the battery monitor 400 may report all digitized values to the processor for validation testing. When the converter 400 and the battery stack is operating properly, it should be expected that the battery cells connected to current sources which are activated will have their voltages reduced by some known, predetermined amount due to the current sink caused by the activation of individual current sources $I_{n-1}$. An error condition arises when a current source, say, $I_n$ is activated by control $C_n$ and the resultant current sink causes the voltage across the battery cell to change by more or less than is expected. In this case, the error may be reported.

The order of conversion could be reversed under external control, i.e. the first conversion before the delay could be on the second ADC and MUX, and the conversion after the delay could be on the first (primary) ADC.

Figure 5:
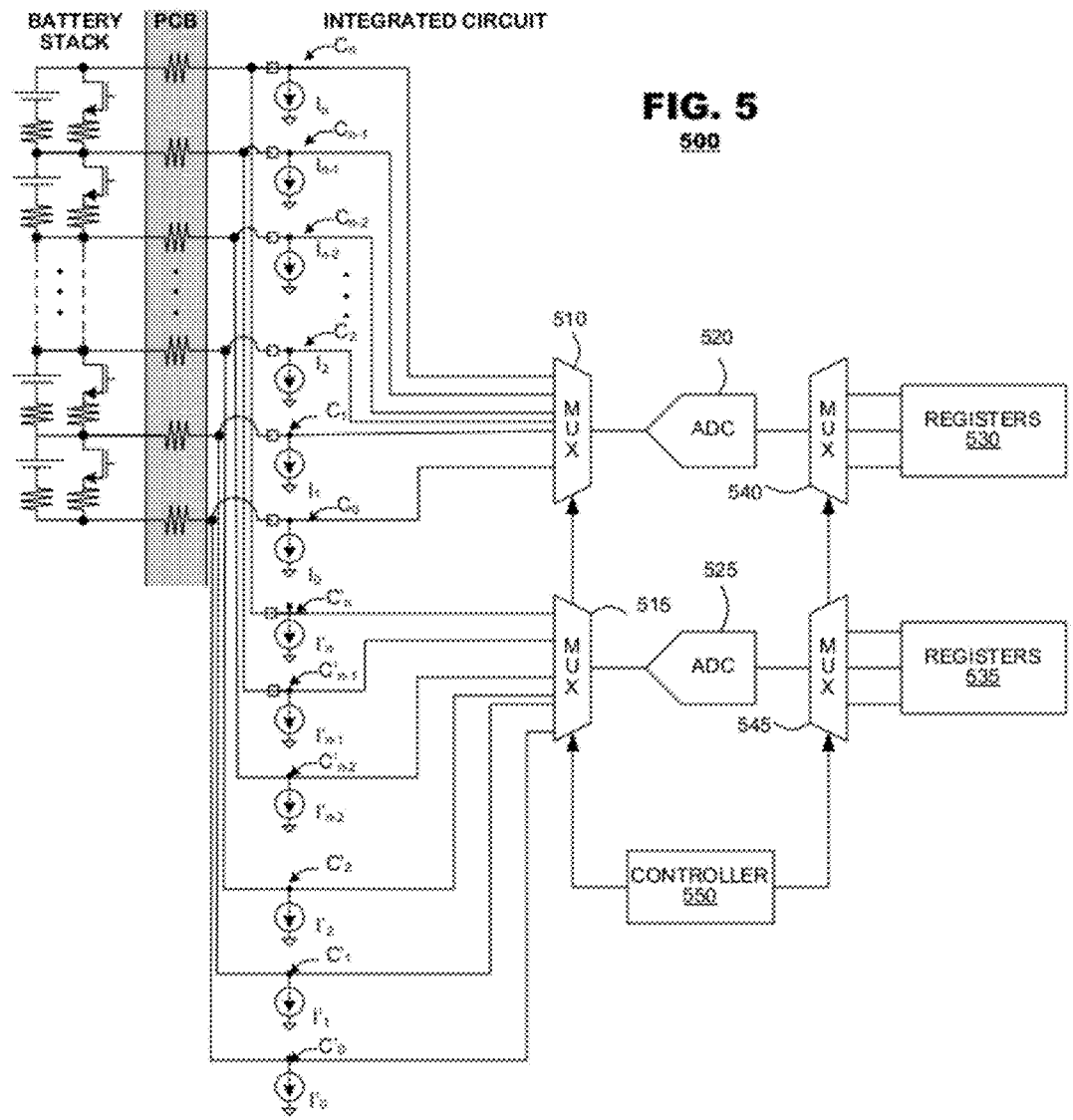
FIG. 5 illustrates a multi-channel converter according to an embodiment of the present invention.

FIG. 5 illustrates another multi-channel converter 500 according to an embodiment of the present invention. In this embodiment, the converter again is illustrated as a battery monitor. The converter 500 may include a pair of input MUXes 510, 515, a pair of ADCs 520, 525, a pair of register files 530, 535, a second pair of MUXes 540, 545 and a controller 550. The input multiplexers 510, 515 each may have inputs coupled to N cells of the battery stack and may output voltages present on a selected input pair to a respective ADC 520, 525. The ADCs 520, 525 each may be coupled to a respective one MUXes 510, 515 and may digitize a voltage different presented at the ADC's inputs. Each of the second pair of MUXes 540, 545 may route digital output of a respective ADC 520, 525 to a designated entry within a respective register file 530, 535.

The converter 500 may include two pairs of channel drivers $C_0$-$C_n$ and $C'_0$-$C'_n$. Each channel driver $C_0$-$C_n$ and $C'_0$-$C'_n$ may include a respective current source $I_0$-$I_n$ and $I'_0$-$I'_n$ connected to input pins of the integrated circuits that are connected to the battery cells. The current sources $I_0$-$I_n$, $I'_0$-$I'_n$ may be activated by the controller 550 (via connections not shown). The controller also may manage operation of the MUXes 510, 515, 540 and 545. In this embodiment, the converter 500 may selectively activate one or more of the current sources $I_0$-$I_n$ or $I'_0$-$I'_n$ to perform its diagnostic test. The controller 550 may introduce a delay between the conversions on ADC 520 and the conversions on ADC 525. This delay also results in the register 535 being populated with data at some predetermined time after register 530.

Provision of separate sets of channel drivers allows diagnostic tests to be performed with two separate channel drivers. For example, a first conversion path formed by MUX 510, ADC 520, MUX 540 and registers 530 may test a first battery cell (say, the cell driven by channel driver $C_n$). At the same time, a second conversion path formed by MUX 515, ADC 525, MUX 545 and registers 535 may test the same battery cell after a predetermined delay. This allows for increased accuracy in the diagnostic tests, and further allows for testing of the channel drivers to ensure proper operation.

The principles of the present invention accommodate further variations. For example, the drivers shown in FIGS. 3-5 may be used with the ADC structure of the counterpart figures. Thus, the dual ADC structure of FIGS. 4-5 may be used in conjunction with battery drivers that use charge balancing switches as shown in FIG. 3. Similarly, the single ADC structure of FIG. 3 may be used in conjunction with current sources as shown in FIG. 4 or FIG. 5.

The converters of FIGS. 3-5 may induce a predetermined delay between the time a new driver configuration is applied and the time that the second digitization operation begins. For example, a delay of 500 µs may be appropriate. In another embodiment, the delay period may be a configurable parameter that can be stored into the converter integrated circuit prior to executing the validation tests. The delay period may be burned into ROM (not shown) on the integrated circuit. Alternatively, the delay period may be provided by an external processor and stored in a register or RAM (also not shown), which of course can be updated during operation.

The converters of FIGS. 3-5 may receive a digital pattern as part of the command message that identifies the test channel(s) to be tested. For example, in an N channel device, the digital pattern may be an N bit field having a first digital value (for example, a "1") for each channel to be reconfigured and a second digital value (a "0") for each channel that is not to be reconfigured in the test. The test channel identifiers may be stored in a register (not shown) on the integrated circuit.

The converters of FIGS. 3-5 may store configuration data identifying a sequence of channels to be tested. In one use case, a processor might send commands at regular intervals but identify channels to be tested according to a predetermined pattern (e.g., channel 1 in a first test, channel 2 in a second test, etc.). In one embodiment, the sequence of channels to be tested may be stored as configuration data stored in a register (not shown) on the integrated circuit and, thus, the channel need not be identified expressly within the command provided to the converter.

The converters of FIGS. 3-5 may include functionality to select the channel to be tested autonomously without express command from a processor. For example, the converters' controller may select a channel by a pseudo-random selection algorithm that randomizes channel selection but causes every channel to be selected at least once within a predetermined period of operation. In this embodiment, the converters may select which channel is to be tested autonomously (perhaps even when to perform the validation test) and may report digitization data to the processor in a manner that indicates the test has been performed and that identifies the channel that has been tested.

There is no requirement that ADCs of FIG. 4 convert to the same level of precision. It is permissible to provide a first ADC with a relatively higher level of accuracy than the second ADC (for example, 14 bits vs. 10 bits). The second ADC need only convert the sampled voltages to a level of precision desired by the validation test.

When a given charge drainage switch (FIG. 3) or current source (FIGS. 4-5) is activated, it may change the voltage of the addressed cell and also voltages of neighboring cells. The validation method may account for voltage changes on neighboring cells in determining whether an error exists.

The principles of the present invention find applications with multi-channel converters as discussed above and also to single channel converters. Although a single channel converter is unlikely to experience errors in coordination between input multiplexers and result registers, the control techniques discussed herein can be useful in diagnosing other faults (for example, open inputs) within the converter signal pipeline.

We claim:

1. A battery monitor, having a plurality of channel inputs, comprising:
    a measurement system to generate measurement information from voltages present on the channel inputs,
    a plurality of channel drivers, each associated with a respective channel input that, when activated, alters a voltage appearing on the respective channel input, and
    a controller to cause the measurement system to activate a selected channel driver and, at a predetermined time after the selected channel driver is activated, generate second measurement information for the channel input associated with the selected channel driver.

2. The battery monitor of claim 1, wherein the channel drivers comprise current sources coupled to respective channel inputs.

3. The battery monitor of claim 1, wherein the channel drivers comprise output pins for connection to control switches within a battery being controlled.

4. The battery monitor of claim 1, wherein the controller locally stores a delay value representing a delay to be applied between generation of activation of a selected channel driver and generation of second measurement information.

5. The battery monitor of claim 1, wherein the controller receives from outside the battery monitor a delay value representing a delay to be applied between generation of activation of a selected channel driver and generation of second measurement information.

6. The battery monitor of claim 1, wherein the measurement system comprises an analog-to-digital converter coupled to the channel inputs by a first multiplexer.

7. The battery monitor of claim 6, wherein the measurement system further comprises a register file coupled to the analog-to-digital converter by a second multiplexer.

8. The battery monitor of claim 6, wherein the measurement system further comprises a pair of register files each coupled to the analog-to-digital converter by a respective multiplexer.

9. The battery monitor of claim 1, wherein the measurement system comprises a pair of analog-to-digital converters each coupled to the channel inputs by a respective multiplexer.

10. The battery monitor of claim 9, wherein the measurement system further comprises a pair of register files each coupled a respective analog-to-digital converter by a respective multiplexer.

11. The battery monitor of claim 1, wherein all components are provided in a common integrated circuit.

12. A method of analyzing and managing operation of a battery monitor, comprising:
    performing a first voltage measurement for at least one input of the battery monitor;
    activating a channel driver of the battery monitor that alters a voltage at the input of the battery monitor,
    performing a second voltage measurement for the at least one input of the battery monitor at predetermined delay after activating the channel driver, wherein a comparison of the first voltage measurement to the second voltage measurement can indicate operational error of the battery monitor.

13. The method of claim 12, further comprising performing the comparison of the first voltage measurement to the second voltage measurement by the battery monitor.

14. The method of claim 12, further comprising: outputting data representative of the first voltage measurement to the second voltage measurement to a processor, and performing the comparison of the first voltage measurement to the second voltage measurement by processor.

15. The method of claim 12, further comprising generating an alert from the comparison of the first voltage measurement to the second voltage measurement.

16. The method of claim 12, wherein the predetermined delay is a configurable operation parameter of the battery monitor.

17. A battery monitor, having a plurality of channel inputs, comprising:
    means for generating first measurement information from a voltage present on channel inputs,
    means for altering a voltage appearing on the respective channel input, and
    means for causing the measurement system to activate a selected channel driver and,
    means for generating second measurement information, at a predetermined time after the altering means is activated, for the channel input associated with the selected channel driver.

18. The battery monitor of claim 17, wherein the means for generating first measurement and means for generating second measurement information include shared circuit components.

19. The battery monitor of claim 17, wherein the means for generating first measurement and means for generating second measurement information include independent circuit components.

20. A non-transitory storage device storing program instructions that, when executed by a controller, cause the controller to:
    cause a measurement system to generate measurement information from voltages present on a plurality of channel inputs to a battery monitor,
    activate a selected channel driver of the battery monitor to alter a voltage present on a channel input associated with the channel driver, and
    at a predetermined time after the selected channel driver is activated, cause the measurement system to generate second measurement information for the channel input associated with the selected channel driver.

21. The battery monitor of claim 1, wherein:
    each channel input is connected across a respective one of a plurality of batteries that generates one of the voltages, and
    each channel driver, when activated, alters the voltage appearing on the respective channel input through a respective switch that bypasses a respective one of the plurality of batteries.

* * * * *